United States Patent
Arens-Fischer et al.

(10) Patent No.: US 6,398,943 B1
(45) Date of Patent: Jun. 4, 2002

(54) PROCESS FOR PRODUCING A POROUS LAYER BY AN ELECTROCHEMICAL ETCHING PROCESS

(75) Inventors: Rüdiger Arens-Fischer, Reutlingen; Michael Berger, Wachtberg; Michael Krüger, Tübingen; Markus Thönissen, Nettetal; Hans Lüth, Aachen, all of (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/581,692
(22) PCT Filed: Dec. 22, 1998
(86) PCT No.: PCT/DE98/03775
§ 371 (c)(1), (2), (4) Date: Jun. 14, 2000
(87) PCT Pub. No.: WO99/34421
PCT Pub. Date: Jul. 8, 1999
(51) Int. Cl.⁷ .................................................. C25F 3/00
(52) U.S. Cl. ...................................................... 205/666
(58) Field of Search ..................... 205/666; 204/224 M, 204/DIG. 7

(56) References Cited

U.S. PATENT DOCUMENTS

| 3,971,710 A | 7/1976 | Romankiw .................... 204/15 |
| 4,092,445 A | 5/1978 | Tsuzuki et al. ............... 427/85 |

OTHER PUBLICATIONS

"Using Porous Silicon as a Sacrificial Layer" by P. Steiner et al. (J. Micromech. MicroEng. 3 (1993) 32–36. No month provided.

"Formation of Porous Silicon on Patterned Subsstrates" by M. Krüger et al. (Thin Solid Films 276 (1996) 257–260). No month provided.

*Primary Examiner*—Kathryn Gorgos
*Assistant Examiner*—Thomas Parsons
(74) *Attorney, Agent, or Firm*—Herbert Dubno

(57) ABSTRACT

A porous layer produced from silicon, germanium or aluminum by applying a wedge-shaped mask to the surface of the layer and by controlled elecrochemical etching along the mask.

5 Claims, 5 Drawing Sheets

PROCESS FOR PRODUCING A POROUS LAYER BY AN ELECTROCHEMICAL ETCHING PROCESS

CROSS REFERENCE TO RELATED APPLICATION

This application is a national stage of PCT/DE98/03795 filed Dec. 22, 1998 and based upon German national application 197 57 560.9 of Dec. 23, 1997 under the International Convention.

BACKGROUND OF THE INVENTION

1. Field of the Invention

The invention relates to a process for producing a porous layer with the aid of an electrochemical etching process. The invention also relates to an optical component.

2. Description of the Related Art

A process for producing a porous layer with the aid of an electrochemical etching process as well as a process is known.

As state of the art it is known, for example, to produce porous silicon (PS) by electrochemical etching of silicon wafers, especially for the use in the production of computer chips. Layers formed in this manner have a structure similar to a sponge and manifest a multiplicity of interesting characteristics.

One field of application for PS is its use in optical components. It is known, for example, from DE 43 19 413.3-33 or Thin Solid Films, 276 (1996), 143–146 to produce waveguides, transmission filters, reflectors or antireflection layers using layer systems of PS. The optical characteristics of the layer system can be varied by the sequence of individual layers with different optical thicknesses.

The optical thicknesses of these individual layers are influenced for a given doping by their porosities and thicknesses. The porosities and thicknesses are controlled for a predetermined doping by the current density or the duration of the electrochemical etching. With control of the duration of the etching only it is possible, for a predetermined substrate and predetermined current density, to set the desired layer thickness. So as to integrate PS with other components, the surface which is to form such structure by etching must be defined. The conventional structuring of the substrate prior to producing the porous layer with an etching mask gives rise to a curvature of the PS/substrate interface during production (FIG. 1). In experiments, strips of a length of 1 cm and a width corresponding to the respective spacings from the next strip were investigated. As can be seen from FIG. 1, there exists two curvatures, one curvature within a strip and a curvature over all of the strips. These curvatures result disadvantageously in an inhomogeneity of the layer (see FIG. 5).

If the characteristic structure is 100 $\mu$m or smaller, the PS/substrate interface is straight (FIG. 2). In the process whereby interface curvature can occur, these small structures can no longer be resolved. For the use of PS which lies below this order of magnitude, the problem of an inhomogeneity of filters and reflectors because of interface curvature no longer exists.

From FIG. 2 it can be seen that a structuring with photolacquer gives rise to a significant underetching of the etching mask. This can be limited by the use of another etching mask material, e.g. silicon nitride ($Si_3N_4$), (see M. Krüger et al, Thin Solid Films 276 (1996) 257–260). With the aid of this mask technique it is possible to fabricate a structure from PS which has both a straight PS/substrate interface and also vertical etching flanks. With these conditions a production of layer systems from porous silicon is possible whose characteristics can be previously determined.

As to production of a multiplicity of porous regions on the same wafer, in the past they could be made only if they were to have the same characteristics. If it was intended that these regions were to constitute pixels of different characteristics, for example, for a filter array of a porous layer system, these could not be simultaneously etched. This resulted in the drawback that previously made porous layers had to be covered so that they would maintain their characteristics during the etching of the new pixels. This procedure is very difficult and expensive to realize and up to now has not truly been possible, since this covering must be removable without leaving residues on the porous layer.

OBJECTS OF THE INVENTION

It is thus the object of the invention to provide a process for producing a porous layer with the aid of an electrochemical etching process in which the aforementioned drawbacks are avoided.

The etching for porosidizing the material is carried out in accordance with the invention using an etching mask. It has been recognized that an etching mask of suitable geometry for the desired characteristics of the deep etching must be formed and used in the process of the invention.

It is further noted within the framework of the invention that the simultaneous formation of pixels within a porosidizable structure with different characteristics is possible in a single working procedure when the etching rate of each pixel is not predetermined only by the externally applied current density but is also collaterally determined by the different environments of the pixels. The environments of the pixels can be so formed by the etching mask that the pixels are subject to different current densities and thus have different etching rates. In this manner the desired different characteristics can be generated.

In this way the process according to the invention enables multiple, especially many, working steps to be replaced by a single step of suitable configuration. A further advantage of this process is that a continuous modification of the characteristics of a porous layer is possible. This process can be used for all electrochemical etching procedures.

According to the invention, the process for producing a porous layer with the aid of an electrochemical etching process can use an etching mask for the desired course of deep etching.

According to another aspect of the invention the process according to the invention is advantageously configured in that a wedge-shaped etching mask is selected to provide a continuous course of the deep-etching rate.

According to another feature, the process of the invention is characterized advantageously in that, for the formation of a discrete course of the deep-etching rate, one or a plurality of wedge-shaped step-shaped structured etching masks are used.

The process according to the invention is advantageously so carried out that silicon, germanium or aluminum is selected as the starting material for porous layer formation. These materials have comparatively well known properties with respect to etching.

Optical components with the layer according to the invention are also deemed to be within the invention.

BRIEF DESCRIPTION OF THE DRAWING

The invention is described in further detail below based upon the Figures and embodiments. They show.

DETAILED DESCRIPTION OF THE INVENTION

Figure 1:
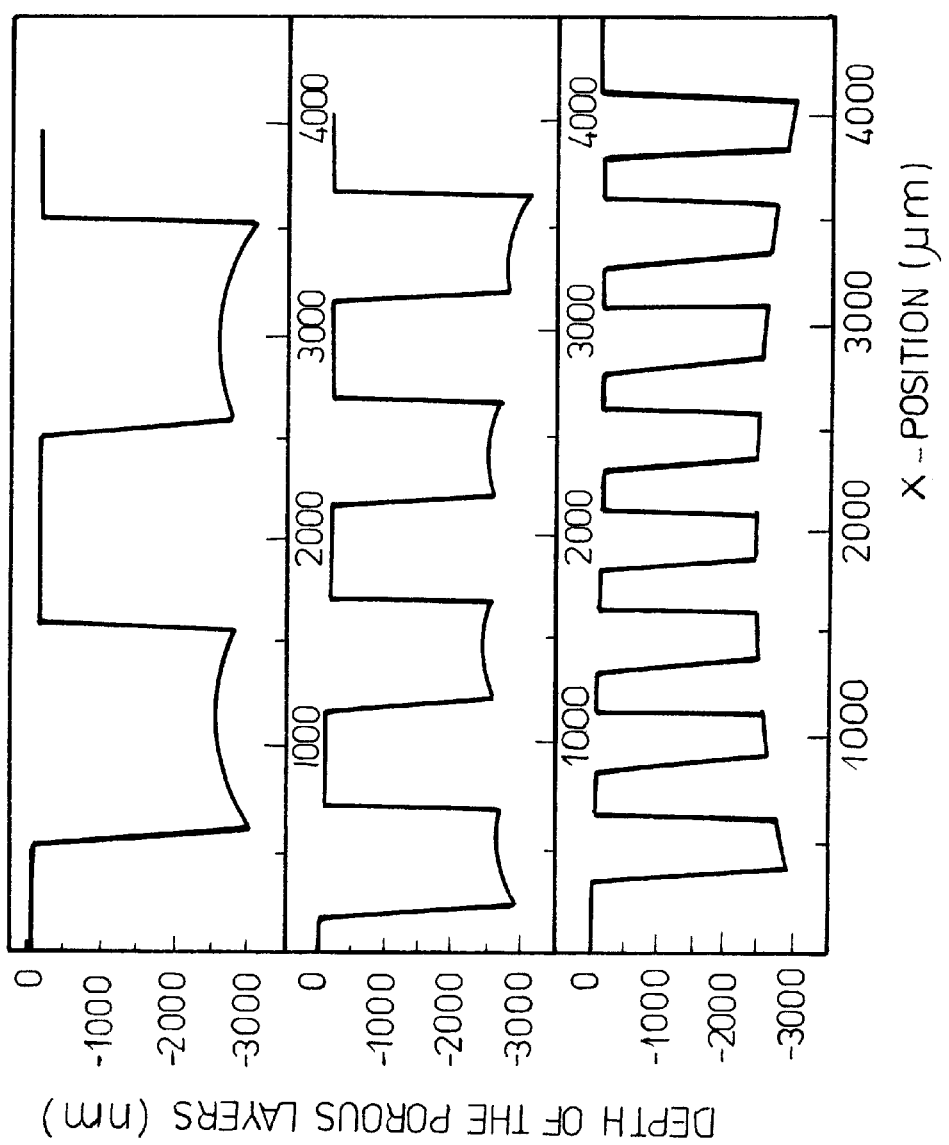
FIG. 1: The depth of the porous strips etched in accordance with the invention, measured with a surface profiler after removal of the porous silicon by caustic soda (NaOH)

In FIG. 1, the depth of the porous strips etched in accordance with the invention are shown, measured with a surface profiler after removal of the porous silicon by caustic soda (NaOH). The strip widths of the here shown structures amount to 1000, 500 or 250 $\mu$m.

Figure 2:
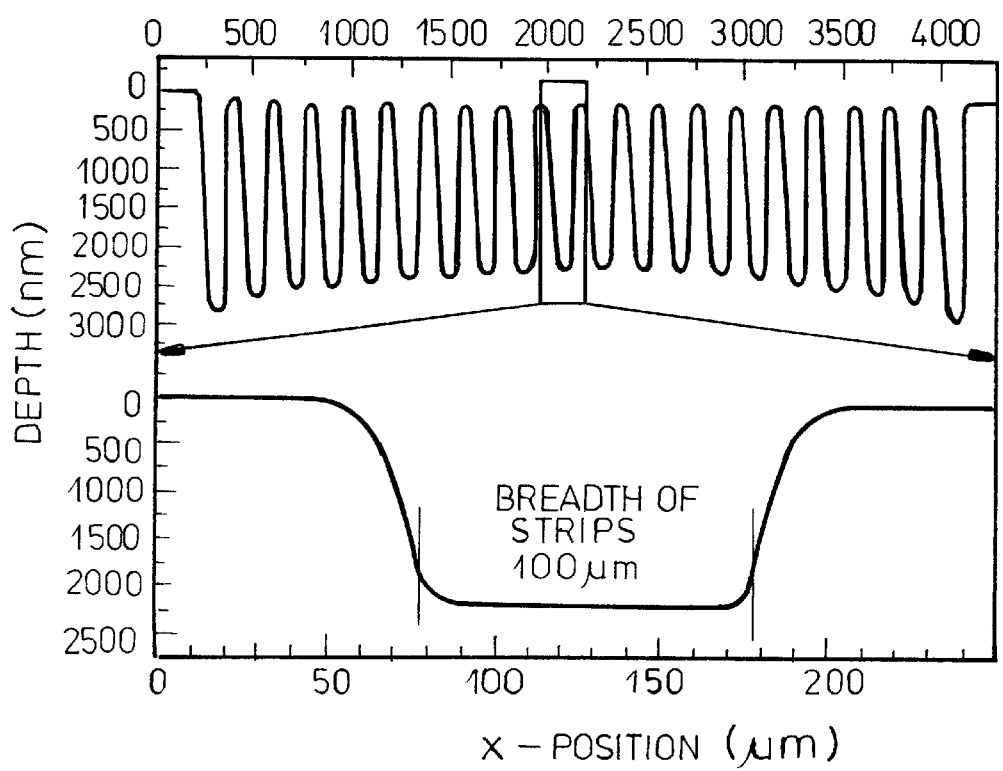
FIG. 2: Depth of the porous strips according to FIG. 1, measured after removal of the porous layer by means of caustic soda.

In FIG. 2, the measured depths of the porous strips according to the invention are shown after the removal of the porous layer by means of caustic soda. It can be appreciated that in the case of a strip width of 100 $\mu$m, the interface of an individual strip is no longer curved but of straight configuration. One should also note the underetching below the mask which is only 100 $\mu$m in width.

Figure 3:
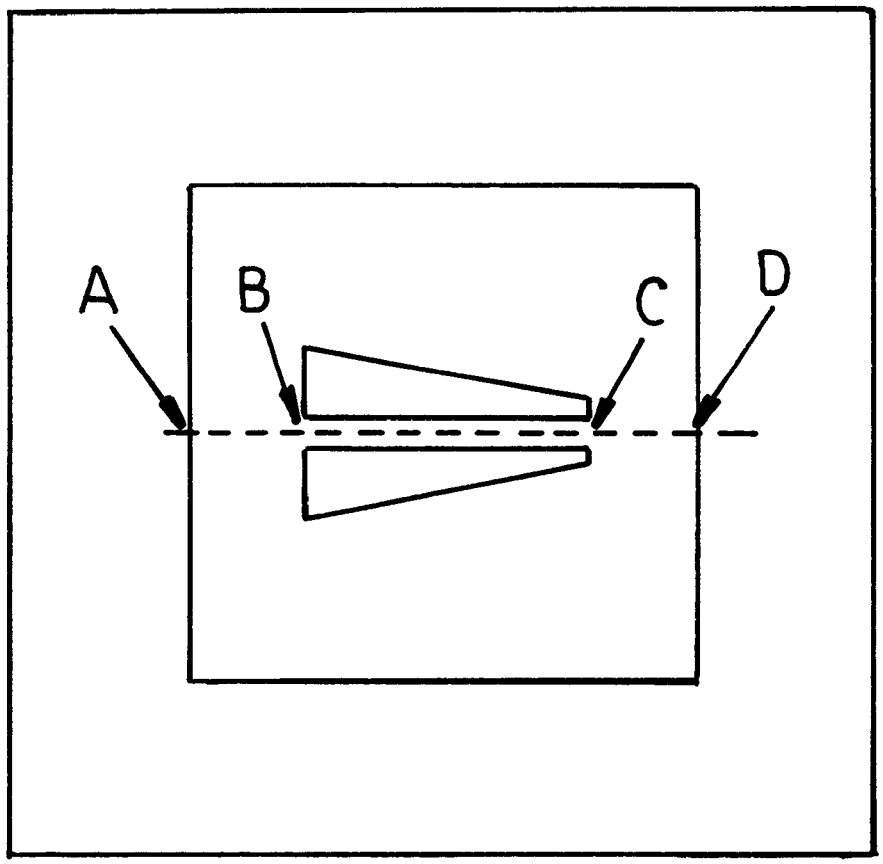
FIG. 3: An etching mask according to the invention for a continuous variation of the etching rate.

In FIG. 3, an etching mask for producing a continuous variation of the etching rate according to the invention is shown. This mask is positioned on the surface to be etched. The surface region below the dark regions of the etching mask are covered, the clear regions of the surface are etched. In this manner, the etching rate can be continuously adjustable or variable in the strips between both wedge structures. Along the indicated line A, B, C, D, the depth profile of the porous layer according to the invention produced in this manner is measured.

Figure 4:
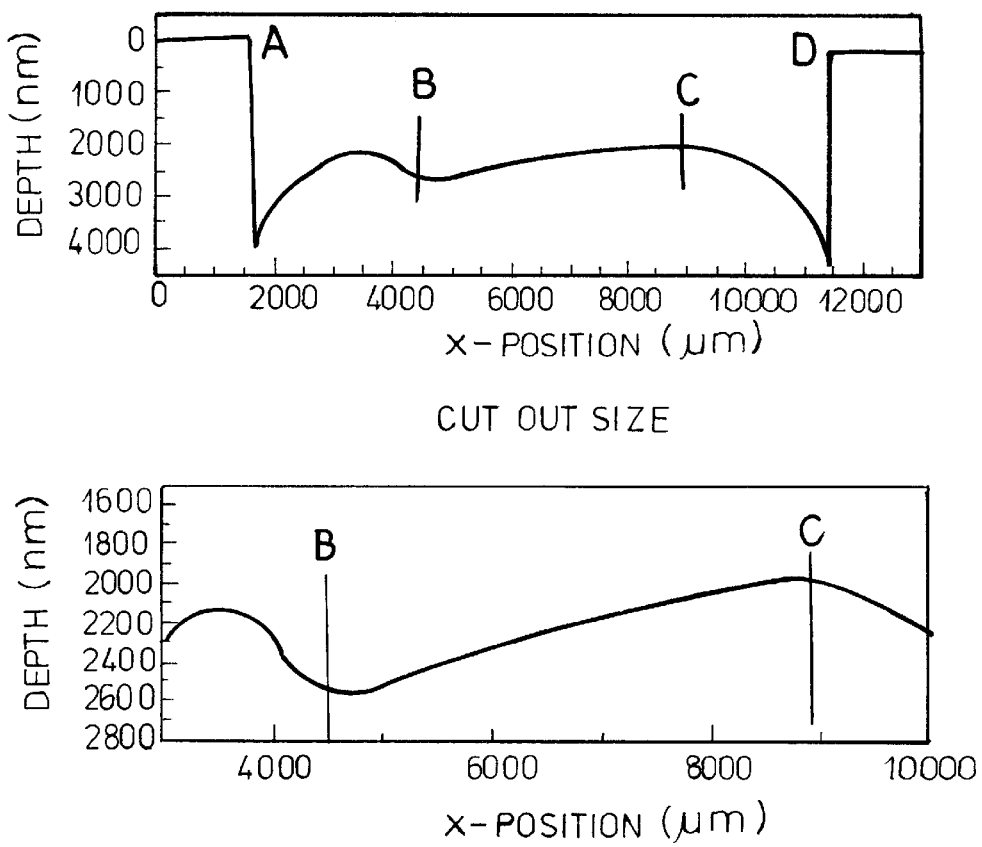
FIG. 4: Surface profile measurement according to the invention, measured after the etching away of the porous region.
Figure 5:
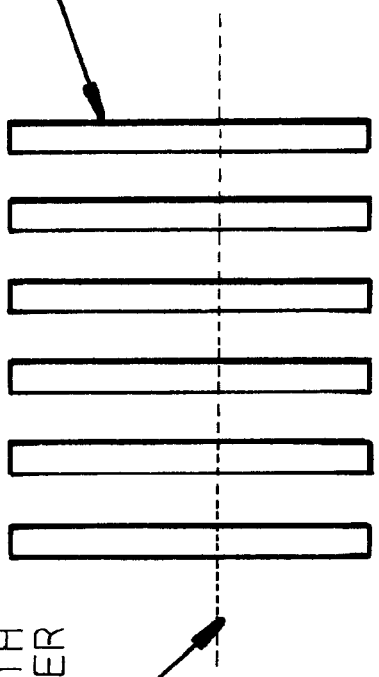
FIG. 5: The measurement principle of the depth profile measurement.

In FIG. 4, this surface profile measurement, measured after the etching away of the porous region according to the invention has been shown. To be noted is the interface between porous silicon and crystalline silicon. The region in which the etching rate is configured to be continuously variable by means of the lateral structuring is given between the points B and C.

With the process according to the invention, it is possible to achieve discrete as well as continuously variable changes in the etching rate. The Example shows a continuous variation of the etching rate with the aid of the etching mask in FIG. 3. The region in which this effect arises is found between the two wedge structures and thus between the points B and C. In this region the two wedge-shaped regions which are not etched vary the etching rate continuously as is apparent from FIG. 4.

What is claimed is:

1. A method of producing a porous layer comprising the steps of:

(a) applying to a surface of a material capable of being porosidized by electrochemical etching at least one wedge-shaped mask controlling etching depth; and (b) electrochemically etching said surface along said mask whereby a deep-etching rate of the etching varies as a function of the shape of said mask.

2. The method defined in claim 1 wherein material is selected from the group which consists of silicon, germanium and aluminum.

3. The method defined in claim 2 wherein the etching rate is varied continuously in step (b).

4. The method defined in claim 2 wherein the etching rate is varied discontinuously in step (b).

5. An optical component having at least one porous layer of a material selected from the group which consists of silicon, germanium and aluminum and porosidized by electrochemical deep etching through a wedge-shaped mask.

* * * * *